United States Patent [19]
Takahashi

[11] Patent Number: 5,877,631
[45] Date of Patent: Mar. 2, 1999

[54] EVALUATION OF THE QUALITY OF WIRING FORMED IN A TEST SEMICONDUCTOR DEVICE

[75] Inventor: Yasuji Takahashi, Hamamatsu, Japan

[73] Assignee: Yamaha Corporation, Japan

[21] Appl. No.: 727,955

[22] Filed: Oct. 9, 1996

[30] Foreign Application Priority Data

Oct. 13, 1995 [JP] Japan .................................. 7-265777

[51] Int. Cl.$^6$ .................................................. G01R 31/11
[52] U.S. Cl. ........................... 324/533; 324/534; 324/535
[58] Field of Search ..................................... 324/527, 528, 324/531, 532, 533, 534, 535, 537, 644, 522, 523

[56] References Cited

U.S. PATENT DOCUMENTS

| | | | |
|---|---|---|---|
| 3,434,049 | 3/1969 | Frye | 324/534 |
| 4,791,351 | 12/1988 | Le Traon et al. | 324/537 |
| 5,498,965 | 3/1996 | Mellitz | 324/532 |
| 5,648,724 | 7/1997 | Yankielun et al. | 324/533 |

*Primary Examiner*—Josie A. Ballato
*Assistant Examiner*—Diep Do

[57] ABSTRACT

An evaluation method for a test semiconductor device having at least two wiring patterns disposed in parallel, wherein: at least one wiring pattern is grounded; a pulse voltage is applied between the grounded wiring pattern and an adjacent wiring pattern; a time required for the pulse to reciprocate along the wiring patterns and a value of a voltage including a reflected voltage between the wiring patterns are measured to judge a presence/absence of a wiring breakage or a wiring short circuit and to locate a wiring breakage point or a wiring short circuit point.

17 Claims, 16 Drawing Sheets

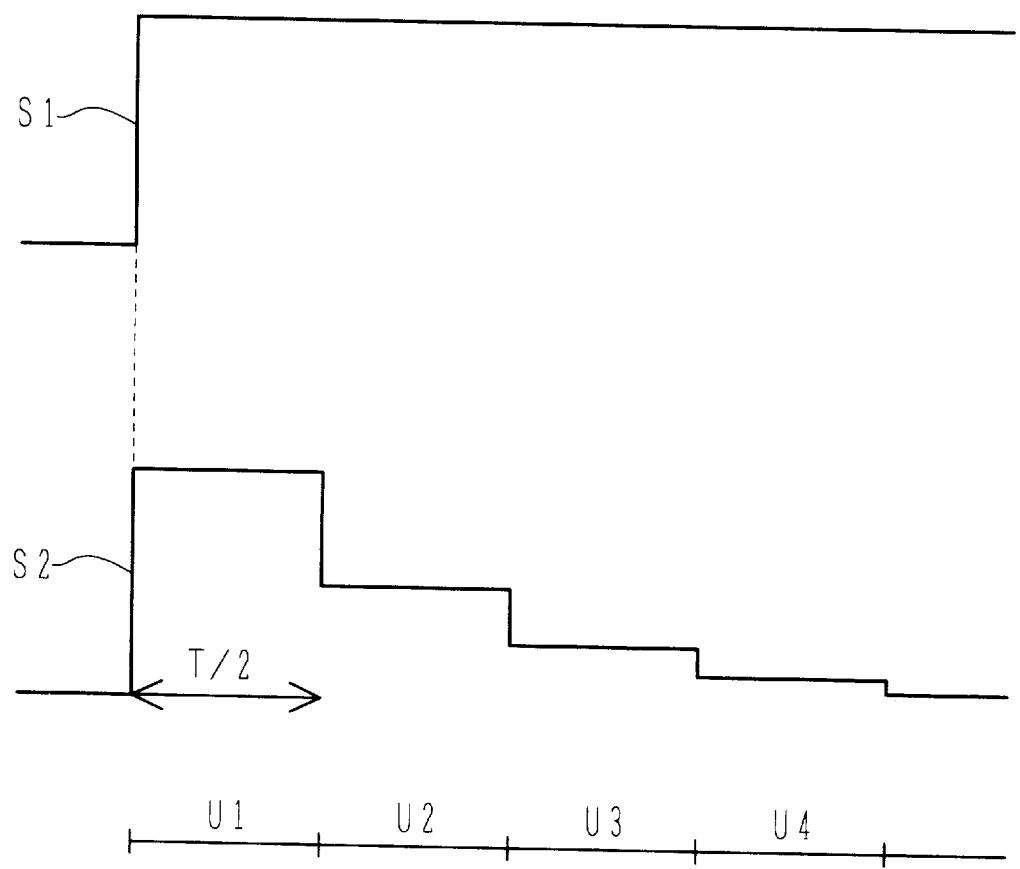

EVALUATION OF THE QUALITY OF WIRING FORMED IN A TEST SEMICONDUCTOR DEVICE

BACKGROUND OF THE INVENTION a) Field of the Invention

The present invention relates to an evaluation method for a test semiconductor device, and more particularly to a method of evaluating the quality of wiring formed on a test semiconductor device.

b) Description of the Related Art

Evaluation of a test semiconductor device (hereinafter called a test element group (TEG)) is performed, for example, when manufacture processes of a semiconductor device is developed or when new circuit design is made. For evaluation, a test wiring pattern (TEG pattern) is formed on a semiconductor device and thereafter the TEG pattern is inspected whether there is an open or short circuit point.

FIGS. 16A and 16B illustrate an evaluation method for TEG according to a conventional technique.

FIG. 16A shows TEG whose wiring is tested as to whether there is any breakage. Electrodes 91 and 91' are connected between opposite ends of a predetermined wiring pattern 92. A voltage is applied across the electrodes 91 and 91'. If current flows, it can be judged that the wiring pattern 92 has no open circuit, whereas if current does not flow, it can be judged that the wiring pattern 92 has an open circuit. In this manner, any breakage of the wiring pattern can be checked.

FIG. 16B shows TEG whose wiring is tested as to whether there is any short circuit. An electrode 95 is connected to a predetermined comb-shaped wiring pattern 96. Another electrode 95' is connected to a predetermined comb-shaped wiring pattern 96'. The wiring patterns 96 and 96' are disposed interdigitally facing each other without mutual contact and are electrically insulated.

A voltage is applied across the electrodes 95 and 95'. If current does not flow, it can be judged that the wiring patterns 96 and 96' are not short circuited, whereas if current flows, it can be judged that the wiring patterns 96 and 96' are short circuited. In this manner, any short circuit between the wiring patterns 96 and 96' can be checked.

It is possible to check whether there is any short or open circuit point in the wiring pattern by using TEGs shown in FIGS. 16A and 16B. However, although it is possible to know that there is a short or open circuit, the position of a short circuit point or an open circuit point of the wiring cannot be located.

SUMMARY OF THE INVENTION

It is an object of the present invention to provide an evaluation method for a test semiconductor device (TEG) capable of checking a presence of a short or open circuit of a wiring and locating the position of a short circuit or open circuit point of the wiring.

According to one aspect of the present invention, there is provided an evaluation method for a test semiconductor device having at least two wiring patterns disposed in parallel, wherein: at least one wiring pattern is grounded; a pulse voltage is applied between the grounded wiring pattern and an adjacent wiring pattern; a time required for the pulse to reciprocate along the wiring patterns and a value of a voltage including a reflected voltage between the wiring patterns are measured to judge a presence/absence of a wiring breakage or a wiring short circuit and to locate a wiring breakage point or a wiring short circuit point.

By measuring the time required for the pulse to reciprocate along the wiring patterns and a value of a voltage including a reflected voltage, not only a wiring breakage or a wiring short circuit can be detected but also a wiring breakage point or a wiring short circuit point can be located. Therefore, the evaluation performance can be improved.

BRIEF DESCRIPTION OF THE DRAWINGS

FIG. 4A is a diagram showing an opened transmission line, and FIG. 4B is an equivalent circuit of the opened transmission line.

FIG. 5A is a diagram showing a short circuited transmission line, and FIG. 5B is an equivalent circuit of the short circuited transmission line.

FIG. 8 shows voltage waveforms of the input pulse S1 and output pulse S2 when a wiring has a defective point of a short circuit.

FIG. 9A is a perspective view of TEG, and FIG. 9B is a cross sectional view taken along line A1–A1'.

FIG. 10A is a perspective view of TEG, and FIG. 10B is a cross sectional view taken along line A2–A2'.

FIG. 12A is a perspective view of TEG, and FIG. 12B is a cross sectional view taken along line A3–A3'.

FIG. 13A is a perspective view of TEG, and FIG. 13B is a cross sectional view taken along line A4–A4'.

FIG. 16A is a diagram illustrating an open circuit test, and FIG. 16B is a diagram illustrating a short circuit test.

DETAILED DESCRIPTION OF THE PREFERRED EMBODIMENTS

Figure 1A:
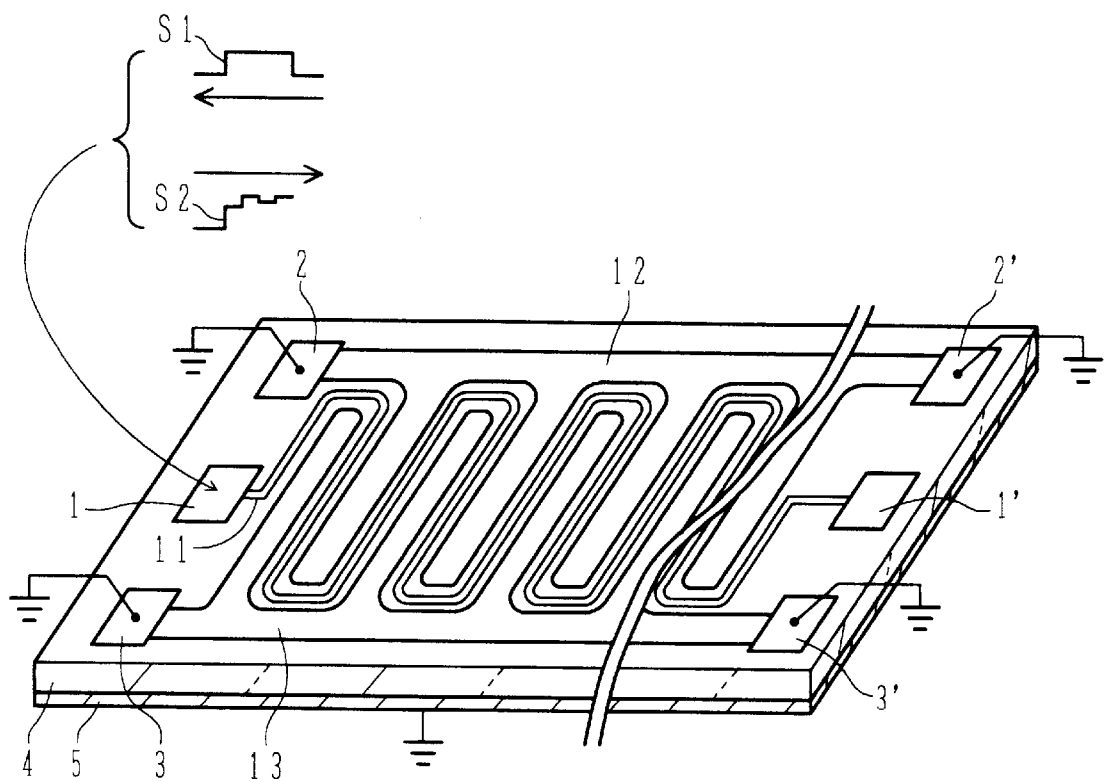
FIG. 1A is a diagram illustrating an evaluation method for a test semiconductor device according to an embodiment of the invention.

FIG. 1A is a diagram illustrating an evaluation method for a test semiconductor device according to an embodiment of the invention.

A substrate has an insulating layer 4 and a conductive layer 5. The conductive layer 5 is grounded. On the surface of the insulating layer 4, electrodes 1, 1', 2, 2', 3, and 3' are formed. The electrodes 1 and 1' are used for measurement, and the electrodes 2, 2', 3 and 3' are ground electrodes.

A predetermined conductive wiring pattern 11 is formed between the electrodes 1 and 1'. A predetermined ground line pattern 12 is formed between the electrodes 2 and 2', whereas another predetermined ground line pattern 13 is formed between the electrodes 3 and 3'. Three wiring patterns 11, 12, and 13 are juxtaposed with each other.

An input pulse S1 generated by an external pulse generator is applied to the measurement electrode 1, and an output pulse is measured thereafter at the electrode 1'. By analyzing the waveform of the output pulse S2, a breakage of the wiring 11 or a short circuit between the wiring 11 and the wiring 12, 13 can be detected. In this case, the short circuit or open circuit point can also be located. The details thereof will be later described.

Figure 1B:
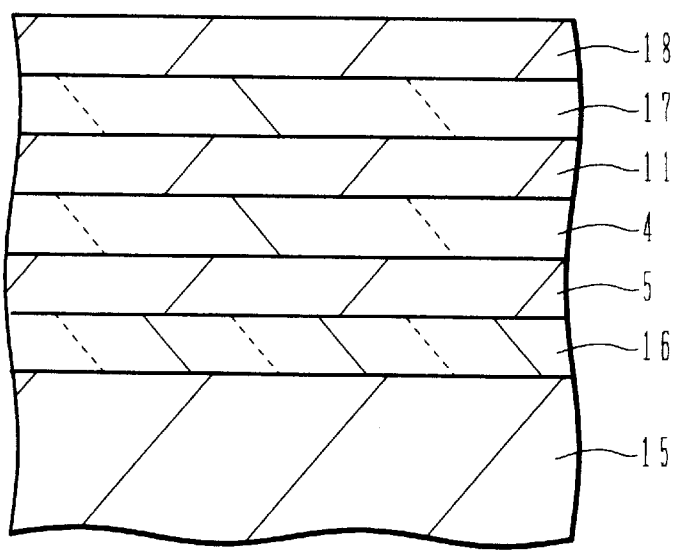
FIG. 1B is a cross sectional view of a test semiconductor device (TEG).

FIG. 1B is a cross sectional view of the test semiconductor device (TEG) of the embodiment.

On the surface of a substrate 15 of silicon, a field oxide film 16 is formed. On this field oxide film, a first metal layer 5, an interlayer insulating film 4, and a second metal wiring layer 11 are sequentially formed which correspond to the elements of FIG. 1A with the same reference numerals. The first metal layer 5 is formed at a predetermined area and grounded. On the second metal wiring layer 11, an interlayer insulating film 17 and a third metal wiring layer 18 are sequentially formed. The ground conductive layer 5 shown in FIG. 1A may be the first metal layer 5 or the substrate 15. In the following description, it is assumed that the first to third metal wiring layers 5, 11, 18 may be used as the conductive wiring layer. TEG is generally formed on a scribe line or at a predetermined chip area of a silicon wafer.

A method of applying the input pulse S1 and a method of measuring the output pulse S2 will be described using specific examples.

Figure 2:
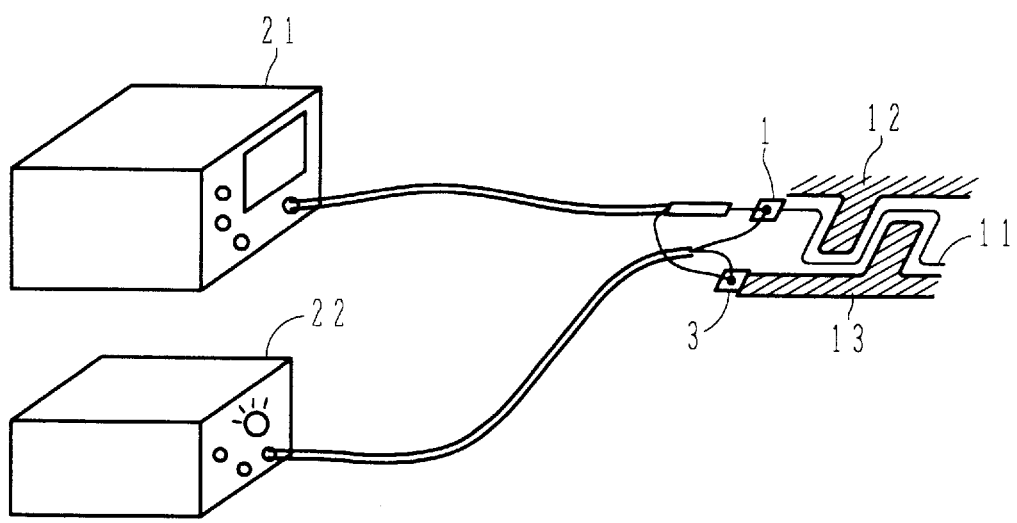
FIG. 2 shows the structure of an evaluating apparatus for TEG of the embodiment.

FIG. 2 shows the structure of an apparatus for evaluating TEG according to the embodiment.

Output terminals of a pulse generator 22 are connected to the measurement electrode 1 and ground electrode 3 of TEG. The ground wiring 12 is connected via a small resistor to the ground wiring 13. The input pulse S1 generated by the pulse generator 22 is supplied to TEG. Input terminals of a ultra-high speed oscilloscope 21 are connected to the measurement electrode 1 and ground electrode 3 to display a voltage waveform between the electrodes 1 and 3.

Figure 3:
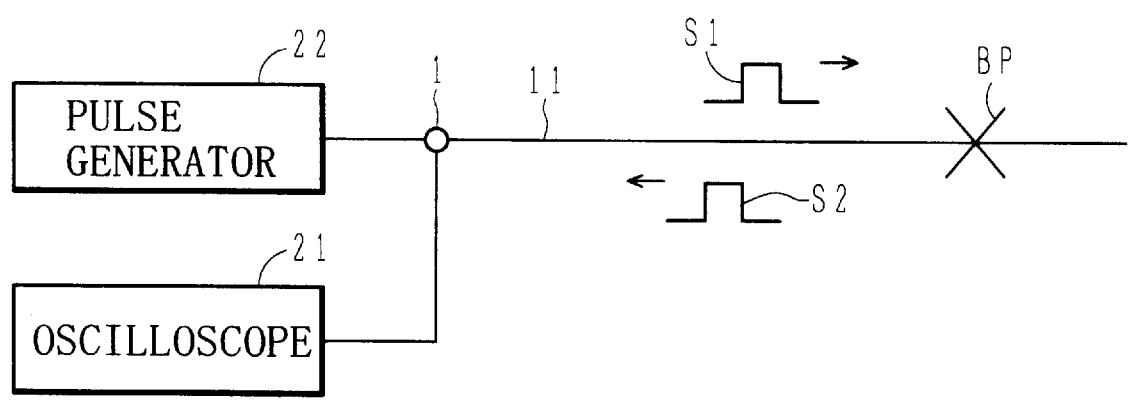
FIG. 3 is a diagram illustrating time domain refractometry (TDR) utilizing pulse reflection characteristics.

FIG. 3 illustrates time domain refractometry (TDR) using pulse reflection characteristics. The pulse generator 22 supplies the input pulse S1 via the electrode 1 to the wiring 11. If the wiring 11 has a defective point BP (e.g., a breakage point of the wiring 11 or a short circuit point between the wiring 11 and adjacent wiring 12, 13), impedance mismatch is generated. The input pulse S1 reflects at the defective point BP and generates a reflected pulse S2. The reflected pulse S2 returns on the wiring 11 to the pulse generator 22. If there is no defective point, the input pulse S1 is reflected at the electrode 1' (FIG. 1A) which is the distal end of the wiring 11.

Whether the wiring 11 is defective or not can be checked by observing the voltage waveform of the reflected pulse S2 with the oscilloscope 21. If it is defective, the defective type of either an open circuit or a short circuit can be discriminated.

By measuring the time required for the input pulse S1 to reciprocate between the electrode 1 and defective point BP, the position of the defective point BP on the wiring 11 can be located. Therefore, the short circuit point or open circuit point of the wiring 11 can be located.

Locating the detective point will be described, respectively for the short circuit point and an open circuit point. If the wiring 11 is considered to be a transmission line, there are a line open state and a line short state. If the wiring 11 is broken, this corresponds to the line open state, whereas if the wiring 11 is short circuited to an adjacent wiring 12, 13, this corresponds to the line short state.

Figure 4A:
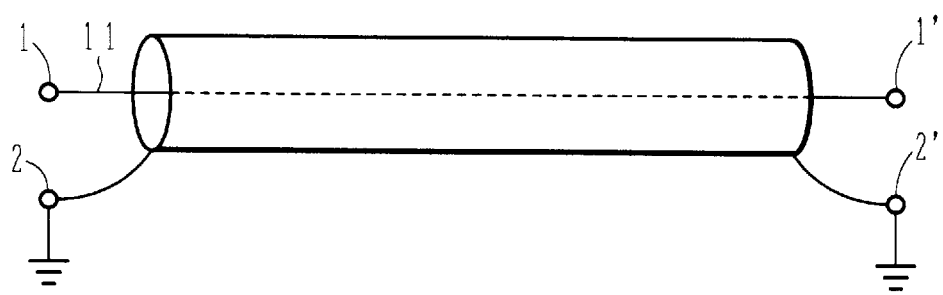
FIGS. 4A and 4B illustrate an open state of a transmission line.

FIGS. 4A ad 4B illustrate the line open state (breakage). FIG. 4A is a schematic diagram of a transmission line in the line open state. A transmission line 11 connects an electrode 1 to the defective point (broken point) 1'. Terminals 2 and 2' are ground terminals. The transmission line 11 is in an open state relative to ground.

Figure 4B:
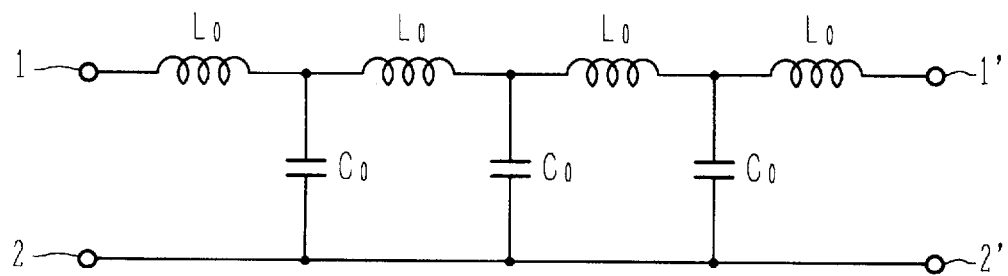

FIG. 4B is an equivalent circuit of the transmission line shown in FIG. 4A. Inductance Lo is inductance per unit length and is serially connected along the transmission line. Capacitance Co is static capacitance per unit length and is connected in parallel along the transmission line.

Figure 5A:
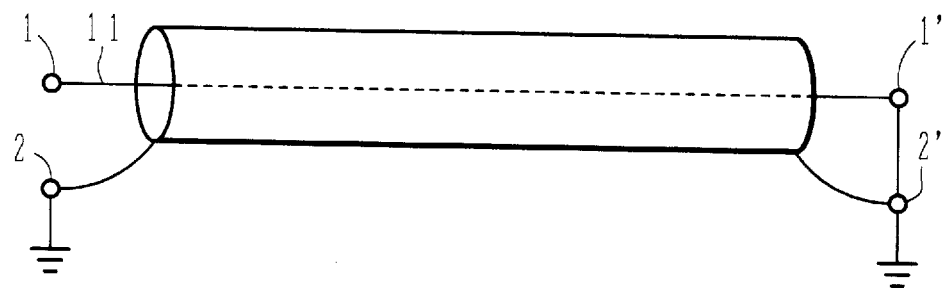
FIGS. 5A and 5B illustrate a short state of a transmission line.
Figure 5B:
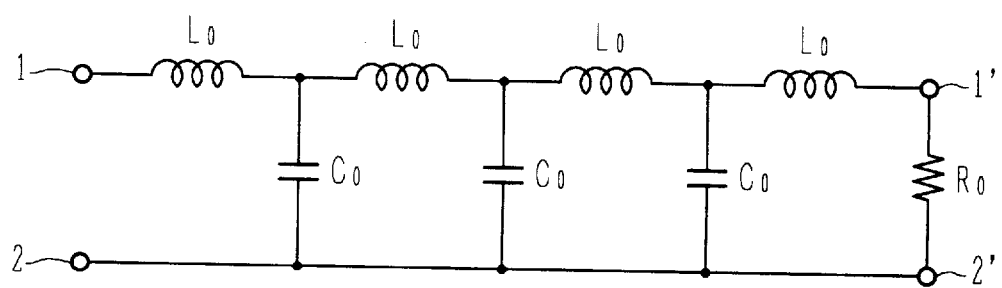

FIGS. 5A and 5B illustrate the line short state (short circuit). FIG. 5A is a schematic diagram of a transmission line in the line short state. A transmission line 11 is short circuited between a defective point 1' and a ground terminal 2'.

FIG. 5B is an equivalent circuit of the transmission line shown in FIG. 5A. Similar to FIG. 4B, inductance Lo is serially connected and capacitance Co is connected in parallel. In this equivalent circuit, the short circuit point is represented by a small resistor Ro, inclusive of resistance of the short circuit line and terminal, connected between the terminal 1' and ground terminal 2'.

Figure 6:
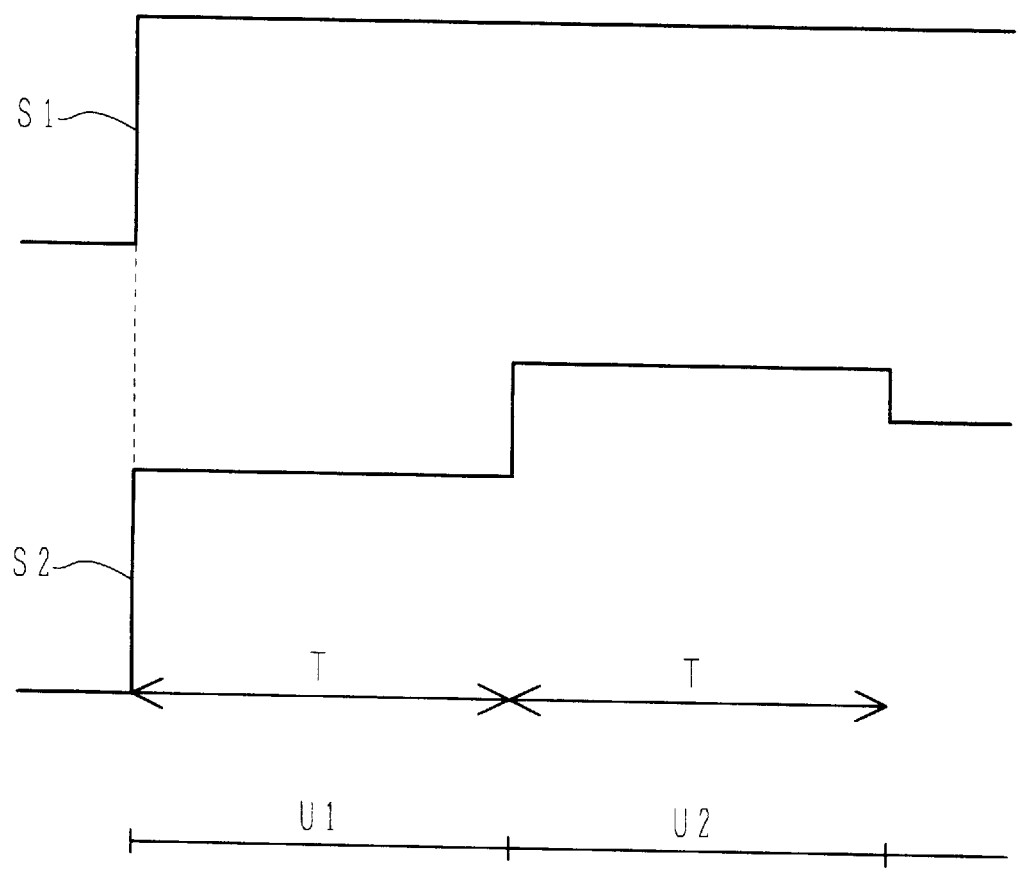
FIG. 6 shows voltage waveforms of an input pulse S1 and an output pulse S2 when a wiring has no defective point.

FIG. 6 shows voltage waveforms of the input pulse S1 and output pulse S2 when the wiring has no defective point. If there is no defective point, the wiring of TEG show in FIG. 1A is in the line open state.

The input pulse S1 is a step pulse having a very short rise time and is applied to the electrode 1. The output pulse S2 rises at the same time when the input pulse S1 rises and maintains a constant level for a time period T. After a lapse of time T after the rise of the input pulse S1, the output pulse S2 again rises and maintains a constant level for a time period T, and thereafter falls. Each time domain is represented by U1, U2, . . . In U1, the input pulse S1 itself is observed as the output pulse S2. In U2, a voltage waveform of the input pulse S1 applied to the electrode 1, reflected at the distal end electrode 1', and returned to the electrode 1, is superposed upon the output pulse S2.

In other words, in U2 the first reflected pulse appears, and thereafter the second, third, . . . reflected pulses sequentially appear, although not shown.

The period T in U1 is a time duration necessary for the pulse to reciprocate between the electrodes 1 and 1'. The period T in U2 is also the same time duration.

Figure 7:
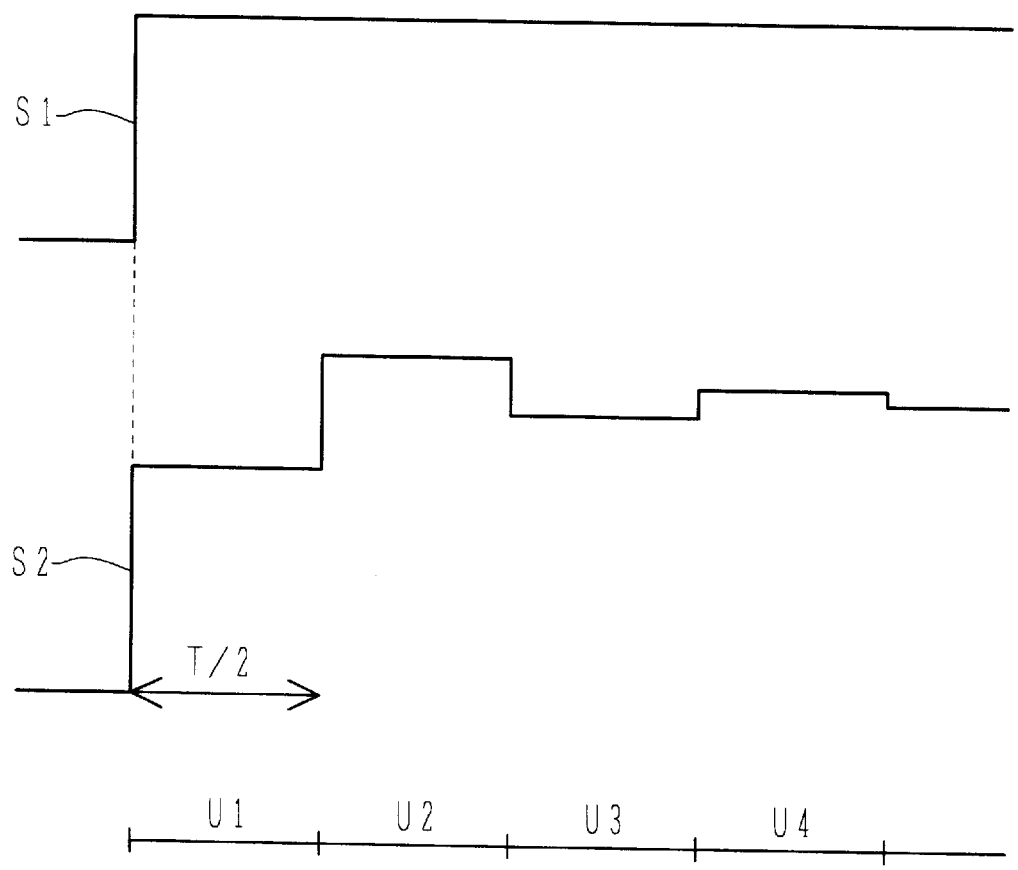
FIG. 7 shows voltage waveforms of the input pulse S1 and output pulse S2 when a wiring has a defective point of an open circuit.

FIG. 7 shows voltage waveforms of the input pulse S1 and output pulse S2 when the wiring is broken and a defective point (open circuit point) is generated. It is assumed here that the wiring breakage occurs at the center of the wiring 11.

A period T/2 in U1 is a reciprocal time required for the input pulse S1 to reflect at the breakage point and return to the electrode 1. Since the wiring 11 has a breakage point at the center thereof, the period T/2 is a half of the period T when the wiring 11 has no breakage point. In U2, U3, U4, . . . the same time period T/2 is required.

In U1, the input pulse S1 itself is observed as the output pulse S2. In U2, the first reflected pulse appears, in U3 the second reflected pulse appears, and in U4 the third reflected pulse appears. Since the distal end (breakage point) of the transmission line is open, the signal is totally reflected.

The peak value in U1 is smaller than that in U2. The peak value in U2 is larger than that in U3. The peak value in U3 is smaller to that in U4. Namely, the peak value alternately becomes large and small as the reflection is repeated. The reflected pulse is gradually attenuated so that the output pulse eventually converges to a predetermined level.

FIG. 8 shows voltage waveforms of the input pulse S1 and output pulse S2 when the wiring is short circuited and a defective point (short circuit point) is generated. It is assumed here that the short circuit point is generated at the center of the wiring 11.

A period T/2 in U1 is a reciprocal time required for the input pulse S1 to reflect at the short circuit point and return to the electrode 1. In U2, U3, . . . the same time period T/2 is required.

In U1, the input pulse S1 itself is observed as the output pulse S2. In U2, the first reflected pulse appears, in U3 the second reflected pulse appears, and in U4 the third reflected pulse appears. Since the distal end (breakage point) of the transmission line is a short circuit point, the signal is not totally reflected but part of it is absorbed. The phase of the reflected wave is inverted. The output pulse S2 rises at the same time when the input pulse S1 rises and maintains a constant level for the time period T/2. After the input pulse S1 rises, the output pulse S2 falls after the lapse of time T/2. This operation is repeated to form a downward stepwise waveform.

As above, the output pulse waveform for wiring breakage (FIG. 7) and that for wiring short circuit (FIG. 8) are different. Therefore, from analysis of the output pulse waveform, it is possible to discriminate between the wiring breakage and wiring short circuit.

In order to discriminate between the types of defects (breakage and short circuit), the peak values in U1 and U2 are compared. If the peak value in U2 is larger than that in U1 (FIG. 7), it is judged that there is a wiring breakage, whereas if the peak value in U2 is smaller than that in U1 (FIG. 8), it is judged that there is a wiring short circuit.

Next, a method of determining whether there is a defective point will be described. Even if the same input pulse S1 is used, the output pulse (FIG. 6) if the wiring has no defective point is different from the output pulse (FIGS. 7 and 8) if the wiring has a defective point.

If the period in U1 is T (FIG. 6), it can be judged that there is no defective point. The period T is a reciprocal time of a pulse when there is no defective point. If the period in U1 is shorter than T (FIGS. 7 and 8), it can be judged that there is a defective point. Irrespective of the type of a defective point, the period in U1 is shorter than T if there is a defective point.

Next, a method of locating the position of a defective point will be described. The period in U1 changes with the position of a defective point. The period in U1 is T if there is no defective point (FIG. 6). The period in U1 is T/2 if a defective point is at the center of the wiring 11 (FIGS. 7 and 8).

The period in U1 is a time necessary for a pulse to reciprocate on the wiring. The measured value of the period in U1 is represented by $t_d$ which is a time necessary for the pulse to reciprocate from the reflected point. The transmission time for the wiring length is $t_d/2$.

As the input pulse S1 is supplied, an electric field and a magnetic field are generated. As a result, an electromagnetic wave is generated. The pulse therefore propagates at the propagation speed of an electromagnetic wave. The electromagnetic wave propagates in vacuum at a light velocity of $c=3\times10^8$ m/s. The distance $LLo$ which an electromagnetic wave propagates in the time $t_d/2$ is therefore given by the following equation.

$LLo=(t_d/2)\times c.$

The above description is limited to vacuum. In the case of a transmission line, the propagation speed of an electromagnetic wave is $1/\epsilon_r^{1/2}$ times that in vacuum, where $\epsilon_r$ is a dielectric constant of dielectric of the transmission line. Therefore, the effective distance LL which the pulse propagates is given by the following equation (1).

$$LL = LLo \times (1/\epsilon_r^{1/2}) \quad (1)$$
$$= (t_d/2) \times c \times (1/\epsilon_r^{1/2})$$

The distance LL is a length of the transmission line. If the transmission line has a defective point, this distance LL is a distance to the defective point. By measuring the time $t_d$ in U1, the distance LL to the defective point can be obtained and the position of the defective point can be located.

In the above example, checking the presence/absence of a defective point and locating the position of the defective point are realized by measuring the time in U1. The time in U2, U3, or the like may be used in place of the time in U1. If the time in U2, U3, or the like is measured, the above method is also used. If a total time of U1+U2 or the like is measured, this time is divided by the number of reflections. The input pulse S1 may be an impulse instead of the step pulse.

The evaluation method for a test semiconductor device has been described by using TEG shown in FIG. 1A. Other TEGs may also be used. Examples of TEG patterns will be described.

Figure 9A:
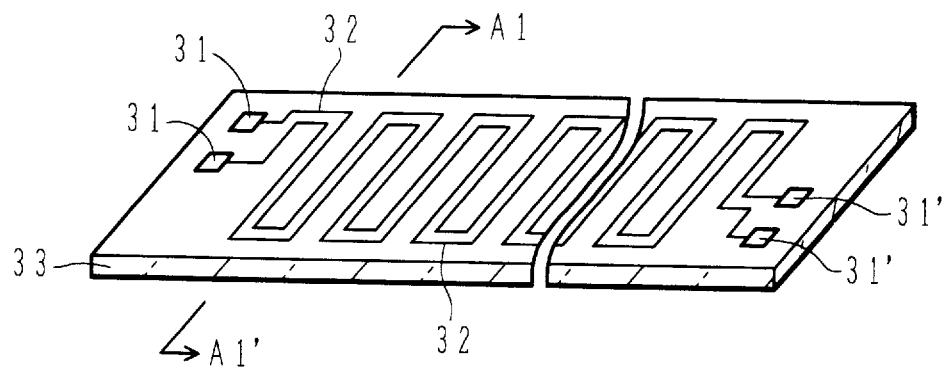
FIGS. 9A and 9B show an example of another TEG structure.
Figure 9B:

FIGS. 9A and 9B show an example of another TEG structure. FIG. 9A is a perspective view of TEG, and FIG. 9B is a cross sectional view taken along line A1–A1'. On an insulator plate 33, two conductive wiring patterns 32, 32 of a predetermined shape are formed in parallel. Electrodes 31 and 31' are connected to the opposite ends of the two wiring patterns 32, 32.

Figure 10A:
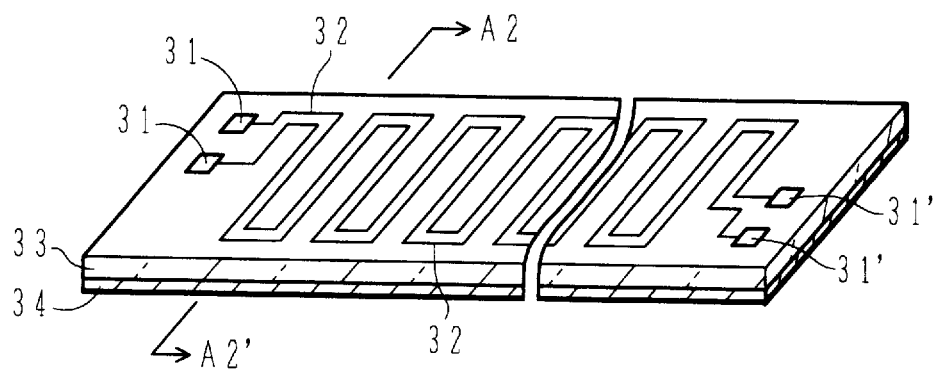
FIGS. 10A and 10B show an example of another TEG structure.
Figure 10B:
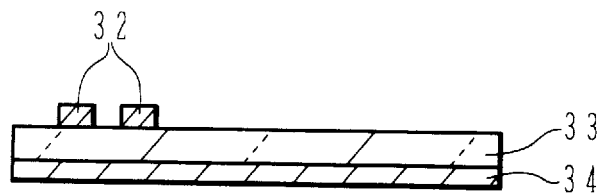

FIGS. 10A and 10B show an example of another TEG structure. FIG. 10A is a perspective view of TEG, and FIG. 10B is a cross sectional view taken along line A2–A2'. This TEG has a conductive plate 34 added to the structure of TEG shown in FIGS. 9A and 9B. The upper surface of the insulator plate 33 is formed with wiring patterns 32, 32 and the whole lower surface thereof is formed with the conductive plate 34.

Figure 11A:
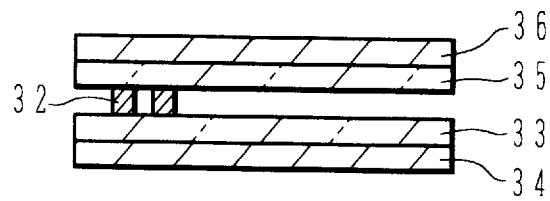
FIGS. 11A to 11C are cross sectional views showing examples of other TEG structures.
Figure 11B:
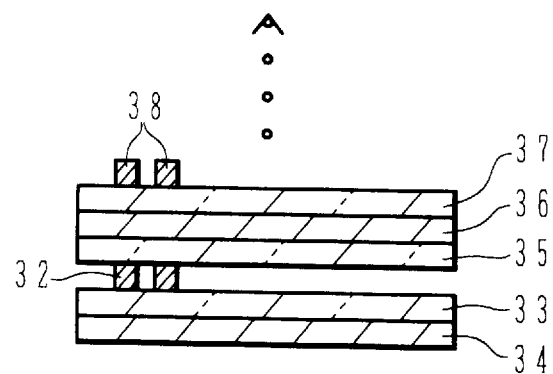
Figure 11C:
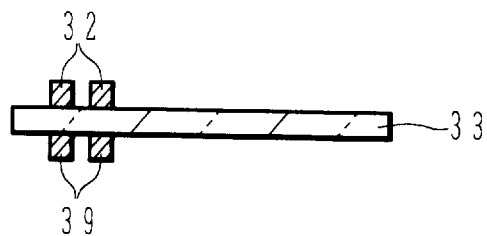

FIGS. 11A to 11C are cross sectional views showing examples of other TEG structures.

TEG shown in FIG. 11A has an insulator plate 35 and a conductive plate 36 formed above the wiring patterns 32, 32 and added to the structure of TEG shown in FIGS. 10A and 10B.

TEG shown in FIG. 11B has another insulator plate 37 formed on the conductive plate 36 and two conductive wiring patterns 38, 38 of a predetermined shape formed on the insulator plate 37. This lamination structure may be stacked one upon another a plurality of times.

TEG shown in FIG. 11C has two conductive wiring patterns 32, 32 formed on the upper surface of an insulator plate 33 and two conductive wiring patterns 39, 39 formed on the lower surface of the insulator plate 33.

Figure 12A:
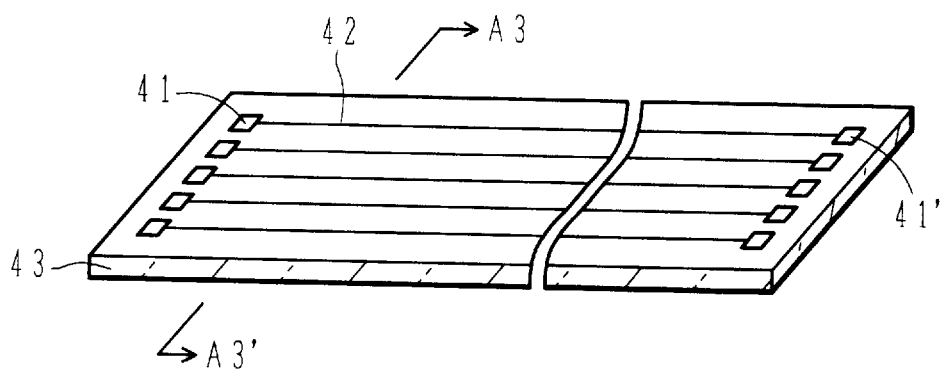
FIGS. 12A and 12B show an example of another TEG structure.
Figure 12B:
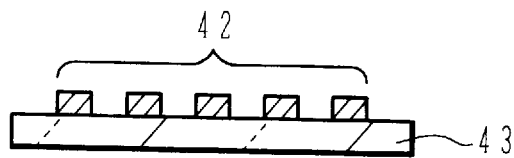

FIGS. 12A and 12B show an example of another TEG structure. FIG. 12A is a perspective view of TEG, and FIG. 12B is a cross sectional view taken along line A3–A3'. Five conductive wiring patterns 42 are formed in parallel on an insulator plate 43. Electrodes 41 and 41' are connected to opposite ends of each conductive wiring pattern 42.

Figure 13A:
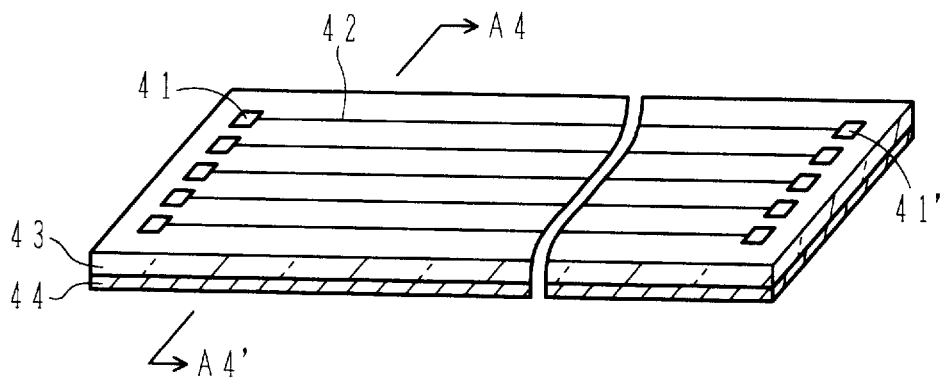
FIGS. 13A and 13B show an example of another TEG structure.
Figure 13B:
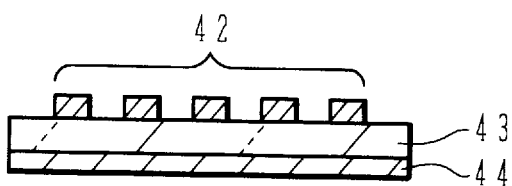

FIGS. 13A and 13B show an example of another TEG structure. FIG. 13A is a perspective view of TEG, and FIG. 13B is a cross sectional view taken along line A4–A4'. This TEG has a conductive plate 44 added to the structure of TEG shown in FIGS. 12A and 12B. The upper surface of the insulator plate 43 is formed with wiring patterns 42, 42 and the whole lower surface thereof is formed with the conductive plate 44.

Figure 14A:
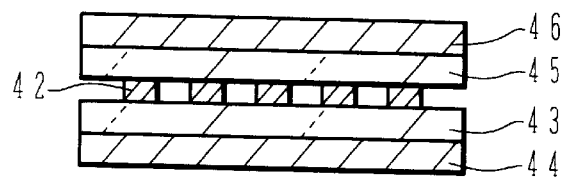
FIGS. 14A to 14C are cross sectional views showing examples of other TEG structures.

TEG shown in FIG. 14A has an insulator plate 45 and a conductive plate 46 formed above the conductive wiring patterns 42 and added to the structure of TEG shown in FIGS. 13A and 13B.

Figure 14B:
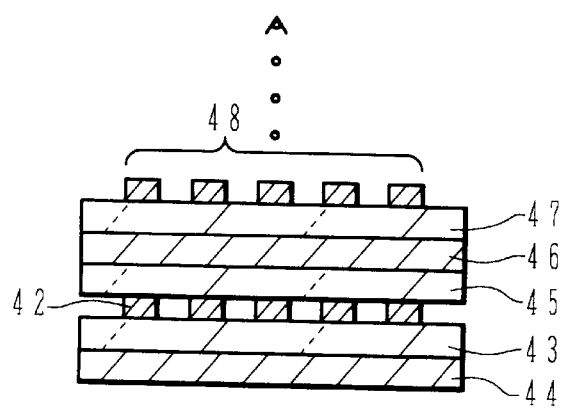

TEG shown in FIG. 14B has another insulator plate 47 formed on the conductive plate 46 and conductive wiring patterns 48, 48, for example, five patterns, formed on the insulator plate 47. This lamination structure may be stacked one upon another a plurality of times.

Figure 14C:
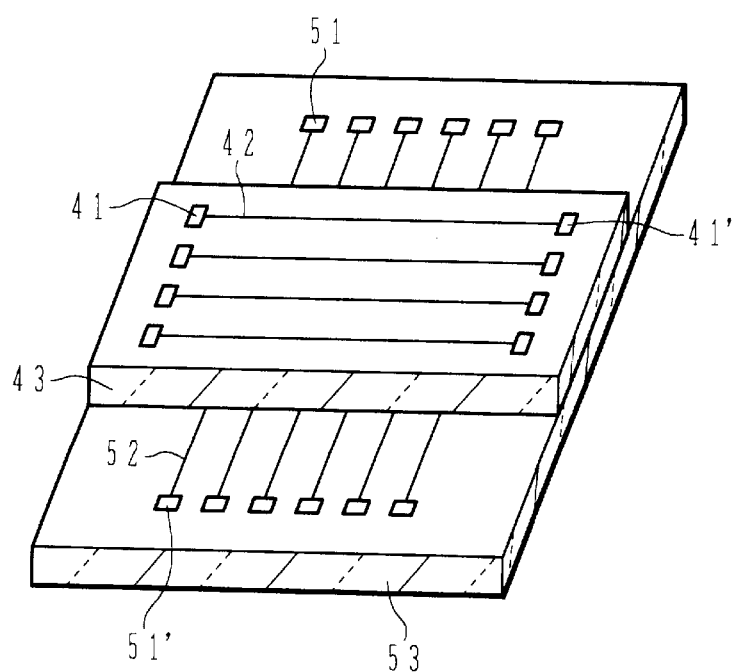

TEG shown in FIG. 14C has conductive wiring patterns 52 disposed vertically and conductive wiring patterns 42 disposed horizontally. The vertical conductive wiring patterns 52 are formed on an insulating plate 53, and an insulator plate 43 is formed above these patterns 52, and the horizontal conductive wiring patterns 42 are formed on this insulator plate 43. Electrodes 51 and 51' are connected to opposite ends of the conductive wiring patterns 52, and electrodes 41 and 41' are connected to opposite ends of the conductive wiring patterns 42.

Test semiconductor devices can be evaluated by using the above TEGs, applying the input pulse between the electrodes, and thereafter measuring the output pulse. TEG is also applicable to silicon substrates including MOS transistors or bipolar transistors, and compound semiconductors.

Figure 15:
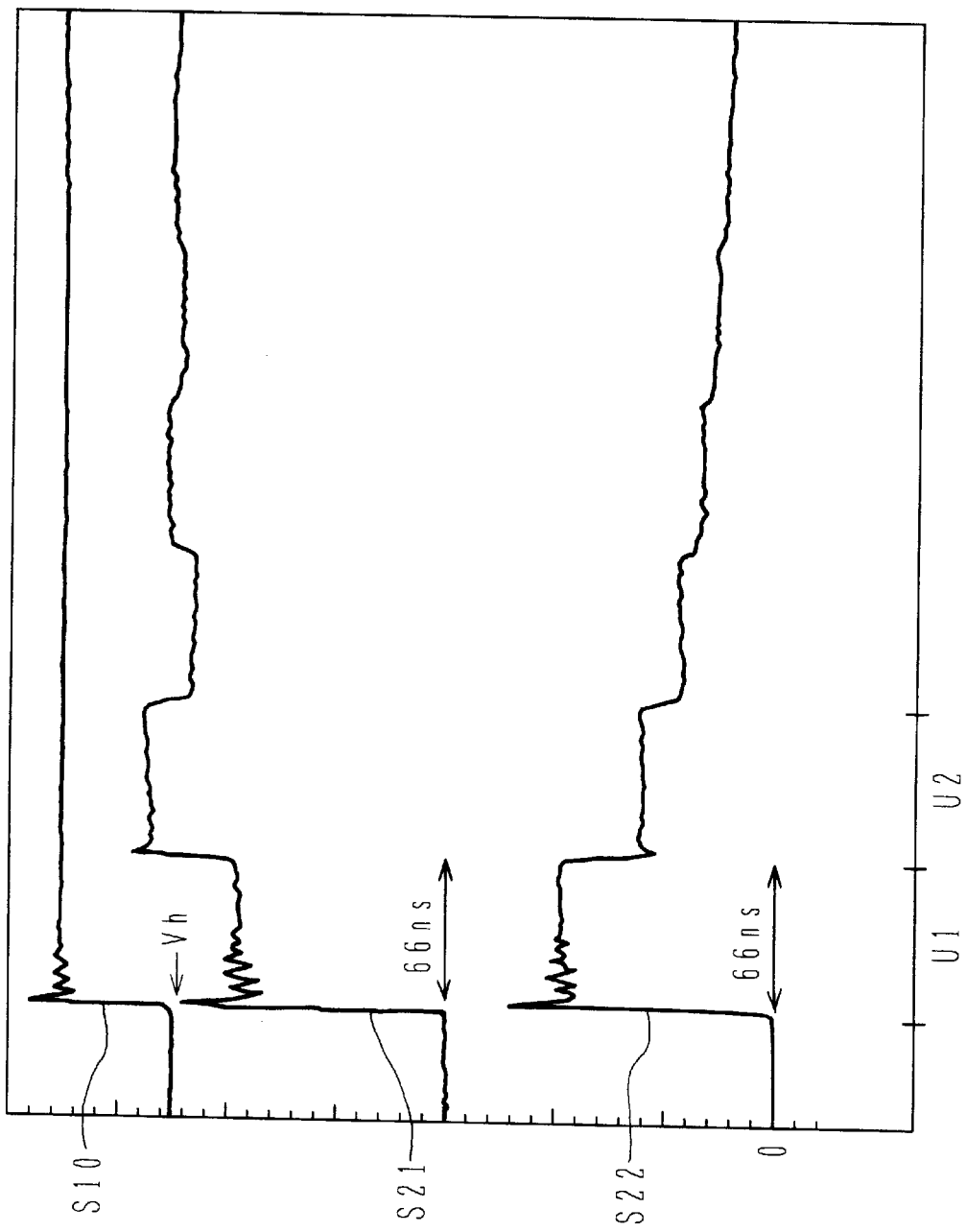
FIG. 15 shows voltage waveforms of an input pulse S10 and output pulses S21 and S22 showing the test results of the embodiment.
Figure 16A:
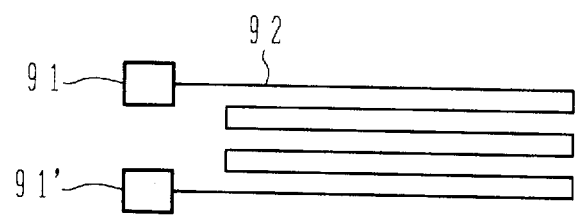
FIGS. 16A and 16B show TEG according to a conventional technique.
Figure 16B:
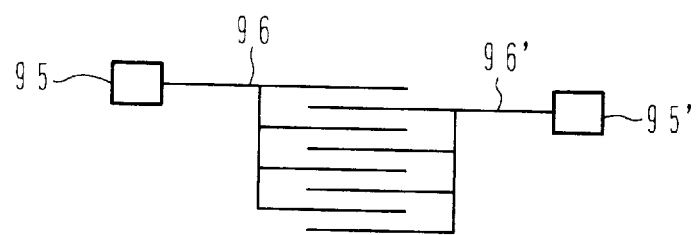

The evaluation experiments were conducted by the above method. FIG. 15 shows voltage waveforms of an input pulse S10 and output pulses S21 and S22 displayed on an oscilloscope.

Experiments were conducted using two types of transmission lines (coaxial cables). One is a transmission line in an open state (FIGS. 4A and 4B) and the other is a transmission line in a short circuit state (FIGS. 5A and 5B).

The same input pulse S10 was used in the experiments for both the transmission lines in the open state and short circuit state. The output pulse S21 observed was for the transmission line in the open state, and the output pulse S22 was for the transmission line in the short circuit state.

The peak value in U1 of the output pulse S21 is smaller than the peak value in U2. It can be judged therefore that this transmission line is in the open state.

The measured time $t_d$ in U1 was 66 ns. The distance LL on the transmission line was calculated by the equation (1), assuming that the wavelength reduction factor of this transmission line is $1/\epsilon_r^{1/2}=0.67$.

$$\begin{aligned} LL &= (t_d/2) \times c \times (1/\epsilon_r^{1/2}) \\ &= (66 \times 10^{-9}/2) \times 3 \times 10^8 \times 0.67 \\ &= 6.633 \text{ m} \end{aligned}$$

The peak value in U1 of the output pulse S22 is larger than the peak value in U2. It can be judged therefore that this transmission line is in the short circuit state.

Similar to the output pulse S21, the measured time $t_d$ in U1 was 66 ns. Therefore, the distance LL on the transmission line is 6.633 m.

From the analysis of the output pulse waveform, it can be judged whether the wiring is in the open state or in the short circuit state. If there is a defect in a wiring pattern of a test semiconductor device, whether this defect is a wiring breakage or wiring short circuit can be easily determined.

Furthermore, by measuring the time required for the input pulse to reflect and return back, it can be judged whether the wiring has a defect or not. If there is no defect, the reciprocal time to and from the distal end of the wiring is measured, whereas if there is a detect, the reciprocal time to and from the defective point is measured. If there is a defect, the distance LL to this defective point can be calculated and the position of the defective point can be located.

Whether the wiring is in the short circuit state or in the open state can be judged from the converged voltage value of the output pulses S21 and S22. If the wiring is in the open state, the output pulse S21 converges toward an input voltage value Vh as the time lapses. The converged voltage is the input voltage value Vh multiplied by a division ratio of the line impedance (resistive components) to the terminating resistance. If the wiring is in the open state, the terminating resistance is infinite so that the output pulse S21 is converged to the input voltage value Vh.

If the wiring is in the short circuit state, the output pulse S22 converges toward 0 V. The converged voltage is determined by a resistance division ratio. If the wiring is in the short circuit state, the line resistance and the resistance at the short circuited point are both near 0 Ω, the output pulse S22 converges near at 0 V.

It can be therefore judged that the wiring is in the open state if the converged voltage is near at the input voltage value Vh or that the wiring is in the short circuit state if the converged voltage is near at 0 V.

The present invention has been described in connection with the preferred embodiments. The invention is not limited only to the above embodiments. It is apparent to those skilled in the art that various modifications, improvements, combinations and the like can be made without departing from the scope of the appended claims.

I claim:

1. An evaluation for a test semiconductor device having at least two wiring patterns disposed in parallel, wherein at least one wiring pattern is grounded, comprising the steps of: applying a pulse voltage between the grounded wiring pattern and an adjacent wiring pattern; measuring a time required for the pulse to reciprocate along the wiring patterns and a value of a voltage including a reflected voltage between the wiring patterns; and judging a presence/absence of a wiring breakage or a wiring short circuit and locating any such wiring breakage point or wiring short circuit point based on the measured time and voltage.

2. An evaluation method for a test semiconductor device according to claim 1, wherein the step of applying a pulse voltage comprises applying a rectangular pulse voltage between the grounded wiring pattern and the adjacent wiring pattern.

3. An evaluation method for a test semiconductor device according to claim 2, wherein if the measured time is in an allowable range of a predetermined time, it is judged that the wiring patterns have no wiring breakage nor a wiring short circuit, and if the measured time is shorter than the predetermined time, it is judged that the wiring patterns have a wiring breakage or a wiring short circuit.

4. An evaluation method for a test semiconductor device according to claim 2, wherein the step of measuring comprises measuring a first voltage value between the wiring patterns at a first time, and a second voltage value at a second time after the lapse of the reciprocal time after the first time, and, in the step of judging, it is judged that the wiring patterns have no wiring short circuit if the first voltage value is smaller than the second voltage value, and it is judged that the wiring patterns have a wiring short circuit if the first voltage value is larger than the second voltage value.

5. An evaluation method for a test semiconductor device according to claim 2, wherein the step of measuring comprises measuring a converged voltage value of a voltage across the wiring patterns changing with a lapse of time, and, in the step of judging, if the converged voltage value is near or at the applied rectangular voltage value, it is judged that the wiring patterns have no wiring short circuit, and if the converged voltage value is near or at 0 V, it is judged that the wiring patterns have a wiring short circuit.

6. An evaluation method for a test semiconductor device according to claim 2, wherein the step of judging comprises determining a distance LL to the wiring breakage point or the wiring short circuit point from:

$$LL=(ta/2)\times c\times(1/\epsilon r^{1/2})$$

where ta is the measured reciprocal time c is a light velocity, and ϵr is a dielectric constant of dielectric of the wiring patterns.

7. An evaluation method for a test semiconductor device according to claim 3, wherein the step of measuring comprises measuring a first voltage value between the wiring patterns at a first time, and a second voltage value is measured after the lapse of the reciprocal time after the first time, and, in the step of judging, it is judged that the wiring patterns have no wiring short circuit if the first voltage value is smaller than the second voltage value, and it is judged that the wiring patterns have a wiring short circuit if the first voltage value is larger than the second voltage value.

8. An evaluation method for a test semiconductor device according to claim 3, wherein the step of measuring comprises measuring a converged voltage value of a voltage across the wiring patterns changing with a lapse of time, and, in the step of judging, if the converged voltage value is near or at the applied rectangular voltage value, it is judged that the wiring patterns have no wiring short circuit, and if the converged voltage value is near or at 0 V, it is judged that the wiring patterns have a wiring short circuit.

9. An evaluation method for a test semiconductor device according to claim 3, wherein the step of judging comprises determining a distance LL to the wiring breakage point or the wiring short circuit point from:

$$LL=(ta/2)\times c\times(1/\epsilon r^{1/2})$$

where ta is the measured reciprocal time, c is a light velocity, and ϵr is a dielectric constant of dielectric of the wiring patterns.

10. An evaluation method for a test semiconductor device according to claim 7, wherein a distance LL to the wiring breakage point or the wiring short circuit point is given by:

$$LL=(t_d/2)\times c\times(1/\epsilon_r^{1/2})$$

where $t_d$ is the measured reciprocal time, c is a light velocity, and $\epsilon_r$ is a dielectric constant of dielectric of the wiring patterns.

11. An evaluation method for a test semiconductor device according to claim 8, wherein a distance LL to the wiring breakage point or the wiring short circuit point is given by:

$$LL=(t_d/2)\times c\times(1/\epsilon_r^{1/2})$$

where $t_d$ is the measured reciprocal time, c is a light velocity, and $\epsilon_r$ is a dielectric constant of dielectric of the wiring patterns.

12. A method of evaluating a test semiconductor device having at least a first wiring pattern and a second wiring pattern disposed in parallel, comprising the steps of:
 (a) fixing the first wiring pattern to a first voltage;
 (b) applying a pulse shaped voltage between the first and second wiring patterns; and
 (c) measuring a time required for the pulse shaped voltage to reciprocate along the first and second wiring patterns and a value of a voltage including a reflected voltage between the first and second wiring patterns; and
 (d) judging a presence/absence of a wiring breakage and wiring short circuit and locating a point of the wiring breakage and the wiring short circuit based on the measured time and voltage.

13. A method according to claim 12, wherein the first voltage is a grounded voltage.

14. A method according to claim 12, wherein step (b) comprises applying a rectangular shaped pulse voltage between the first wiring pattern and the second wiring pattern.

15. A method of evaluating a test semiconductor, comprising the steps of:
 (a) providing an element having a first wiring pattern and a second wiring pattern and a third wiring pattern juxtaposed to each other;
 (b) fixing the first and second wiring patterns to a first voltage;
 (c) applying a pulse shaped voltage between the first and third wiring patterns; and
 (d) measuring a time required for the pulse shaped voltage to reciprocate along the first and third wiring patterns and a value of a voltage including a reflected voltage between the first and third wiring patterns; and
 (e) judging a presence/absence of a wiring breakage and wiring short circuit and locating a point of the wiring breakage and the wiring short circuit based on the measured time and voltage.

16. A method according to claim 15, wherein the first voltage is a grounded voltage.

17. A method according to claim 15, wherein step (c) comprises applying a rectangular shaped pulse voltage between the first wiring pattern and the third wiring pattern.

\* \* \* \* \*